(12) United States Patent
Ziazadeh et al.

(10) Patent No.: US 7,256,651 B1
(45) Date of Patent: Aug. 14, 2007

(54) SYSTEM AND METHOD FOR PROVIDING A CONSTANT SWING HIGH-GAIN COMPLEMENTARY DIFFERENTIAL LIMITING AMPLIFIER

(75) Inventors: Ramsin M. Ziazadeh, San Jose, CA (US); Yongseon Koh, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 205 days.

(21) Appl. No.: 11/034,041

(22) Filed: Jan. 12, 2005

(51) Int. Cl.
*H03F 3/45* (2006.01)
(52) U.S. Cl. .................. 330/253; 330/264
(58) Field of Classification Search ........... None
See application file for complete search history.

(56) References Cited

U.S. PATENT DOCUMENTS 6,956,436 B2 * 10/2005 Li et al. ............ 330/258
6,985,035 B1 * 1/2006 Khorramabadi ...... 330/253

* cited by examiner

*Primary Examiner*—Khanh Van Nguyen

(57) ABSTRACT

A system and a method are disclosed for providing a constant swing high-gain complementary differential limiting amplifier. High gain for the differential amplifier is created by providing a current to the driving transistors that is a combination of any of (a) constant current, (b) transconductance based current, and (c) temperature compensated based current. A constant differential output swing is created by providing a varying differential current to the output load resistors of the differential amplifier that tracks process and temperature variations within the output load resistors.

21 Claims, 3 Drawing Sheets

SYSTEM AND METHOD FOR PROVIDING A CONSTANT SWING HIGH-GAIN COMPLEMENTARY DIFFERENTIAL LIMITING AMPLIFIER

TECHNICAL FIELD OF THE INVENTION

The present invention is generally directed to the manufacture of differential amplifiers in semiconductor circuits and, in particular, to a system and method for providing a constant swing high-gain complementary differential limiting amplifier.

BACKGROUND OF THE INVENTION

In the telecommunications industry data transfer rates continue to increase. As data transfer rates continue to increase there are increasing demands made on the capabilities of closed-loop amplifiers. In particular, it is becoming increasing difficult to meet the stability criteria for closed-loop amplifiers that are capable of handling the data rates demanded for modern telecommunication channels. For this reason, the design and development of open-loop limiting amplifier cells are becoming increasingly important.

Prior art differential amplifier circuits are generally capable of providing a constant output differential voltage swing. However, prior art differential amplifier circuits are not generally able to maintain high levels of gain at the same time that they provide a constant output differential voltage swing. That is, the techniques employed by prior art differential amplifiers create significant variations in the amplifier gain.

Therefore, there is a need in the art for a system and method that is capable of providing an improved differential amplifier circuit that is capable of providing both high levels of amplifier gain and a constant output differential voltage swing.

SUMMARY OF THE INVENTION

To address the above-discussed deficiencies of the prior art, it is a primary object of the present invention to provide a system and method for providing an improved differential amplifier circuit that is capable of providing both high levels of amplifier gain and a constant output differential voltage swing.

In one advantageous embodiment, the differential amplifier circuit of the invention comprises means for providing a varying differential current through first and second output load resistors of the differential amplifier circuit. The varying differential current tracks process and temperature variations within the first and second output load resistors. The varying differential current through the first and second output load resistors provides a constant output differential voltage swing.

The differential amplifier circuit of the invention also comprises means for providing a differential current through the driving transistors of the differential amplifier circuit. The differential current comprises a combination of any of a constant current, a transconductance based current, and a temperature compensated based current. The differential current through the driving transistors provides a high level of amplifier gain for the differential amplifier circuit.

It is an object of the present invention to provide a system and method for providing an improved differential amplifier circuit that is capable of providing both high levels of amplifier gain and a constant output differential voltage swing.

It is also an object of the present invention to provide a system and method for providing a differential current to the driving transistors of a differential amplifier circuit that is a combination of any of a constant current, a transconductance based current, and a temperature compensated based current.

It is yet another object of the present invention to provide to provide a system and method for providing a varying differential current to the output load resistors of a differential amplifier circuit that tracks process and temperature variations within the output load resistors.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
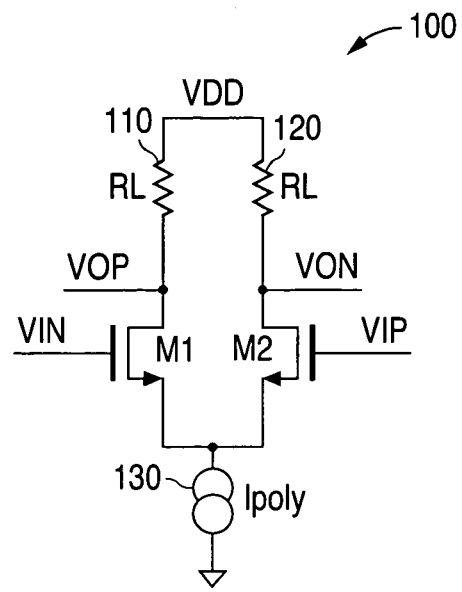
FIG. 1 illustrates a schematic diagram of a prior art differential amplifier circuit.

FIGS. 1 through 4 and the various embodiments used to describe the principles of the present invention in this patent document are by way of illustration only and should not be construed in any way to limit the scope of the invention. Those skilled in the art will understand that the principles of the present invention may be implemented in any type of suitably arranged circuitry for providing a differential amplifier.

To simplify the drawings the reference numerals from previous drawings will sometimes not be repeated for structures that have already been identified.

In order to better understand the principles of the present invention a description of an exemplary prior art differential amplifier circuit will first be given. The exemplary prior art differential amplifier circuit 100 shown in FIG. 1 comprises a first NMOS transistor M1, a second NMOS transistor M2, a pull up resistor 110 (having a value of resistance equal to RL), a pull up resistor 120 (having a value of resistance equal to RL), and a current source 130 (having a value of current equal to Ipoly).

As shown in FIG. 1, the source of first NMOS transistor M1 and the source of second NMOS transistor M2 are connected together and to a first end of current source 130. A second end of current source 130 is connected to ground. The drain of first NMOS transistor M1 is connected to a first end of pull up resistor 110 and the drain of second NMOS transistor M2 is connected to a first end of pull up resistor 120. The second end of pull up resistor 110 and the second end of pull up resistor 120 are both connected to the supply voltage VDD.

The gate of first NMOS transistor M1 is connected to input signal VIN. The gate of second NMOS transistor M2 is connected to input signal VIP. The input signals VIN and VIP are differential input signals. The output signal VOP is taken at a point located between the drain of first NMOS transistor M1 and the first end of pull up resistor 110. The output signal VON is taken at a point located between the drain of second NMOS transistor M2 and the first end of pull up resistor 120. The operation of the prior art differential amplifier circuit 100 shown in FIG. 1 is well known in the art.

The NMOS tail current source is the current source 130. Current source 130 has a value of current equal to Ipoly. When the differential input signal VIN is equal to the differential input signal VIP, then the differential amplifier circuit 100 is balanced and the current Ipoly is evenly divided between the two branches.

Specifically, when the differential amplifier circuit 100 is balanced, the value of the current through the first NMOS transistor M1 is one half of Ipoly (i.e., Ipoly/2) and the value of the current through the second NMOS transistor M2 is also one half of Ipoly (i.e., Ipoly/2). This means that the value of the current that flows through the output load of pull up resistor 110 is one half of Ipoly (i.e., Ipoly/2) and the value of the current that flows through the output load of pull up resistor 120 is one half of Ipoly (i.e., Ipoly/2).

Prior art differential amplifier circuits such as differential amplifier circuit 100 provide a constant output differential swing voltage. For convenience of description in this document, the constant output differential swing voltage will sometimes be referred to as a "constant swing." The constant swing for an internal load resistor (poly resistor) (e.g., pull up resistor 110 or pull up resistor 120) requires a varying bias current (e.g., plus or minus twenty five percent (+/− 25%)) which tracks the poly resistor process and temperature variations. This indirectly degrades the transconductance ($g_m$) of the differential amplifier circuit, and consequently, causes large variations in the gain of the differential amplifier circuit.

In other words, the constant swing is often compromised in prior art differential amplifier circuits by introducing Ipoly based current in the driving transistors (i.e., M1 and M2). The Ipoly based current in the driving transistors degrades the transconductance ($g_m$) of the differential amplifier because the poly resistor process and temperature variation does not track with the transconductance variation in the driving transistors. Therefore, a prior art differential amplifier can provide constant swing but exhibits a large variation in the gain of the amplifier.

The present invention overcomes this deficiency by providing a complementary based limiting amplifier circuit that (1) allows the differential current in the output load to have the same value as it does in a prior art circuit, and (2) allows the differential current through the driving transistors to be any combination of (a) constant current, (b) transconductance based current, and (c) temperature compensated based current. As will be more fully described, the complementary based limiting amplifier circuit of the present invention provides a differential amplifier that is capable of achieving high gain as well as constant swing.

Figure 2:
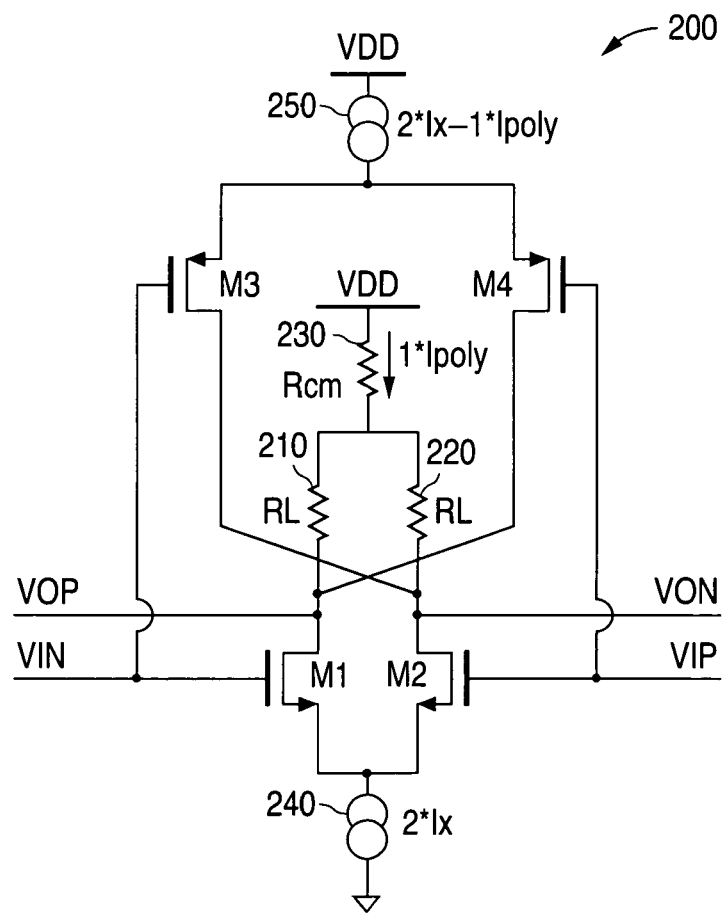
FIG. 2 illustrates a schematic diagram of a first advantageous embodiment of a constant swing, high-gain complementary input limiting differential amplifier of the present invention.

FIG. 2 illustrates a schematic diagram of a first advantageous embodiment of a constant swing, high-gain complementary input limiting differential amplifier 200 of the present invention. The differential amplifier circuit 200 shown in FIG. 2 comprises a first NMOS transistor M1, a second NMOS transistor M2, a first PMOS transistor M3, a second PMOS transistor M4, a pull up resistor 210 (having a value of resistance equal to RL), a pull up resistor 220 (having a value of resistance equal to RL), a resistor 230 (having a value of resistance equal to Rcm), a first current source 240 having a value of current equal to 2*Ix, and a second current source 250 having a value of current equal to (2*Ix−1*Ipoly).

As shown in FIG. 2, the source of first NMOS transistor M1 and the source of second NMOS transistor M2 are connected together and to a first end of first current source 240. A second end of first current source 240 is connected to ground. The drain of first NMOS transistor M1 is connected to a first end of pull up resistor 210 and the drain of second NMOS transistor M2 is connected to a first end of pull up resistor 220. The second end of pull up resistor 210 and the second end of pull up resistor 220 are both connected to a first end of resistor 230. A second end of resistor 230 is connected to the supply voltage VDD.

The gate of first NMOS transistor M1 is connected to input signal VIN. The gate of second NMOS transistor M2 is connected to input signal VIP. The input signals VIN and VIP are differential input signals. The output signal VOP is taken at the drain of first NMOS transistor M1. The output signal VON is taken at the drain of second NMOS transistor M2.

As also shown in FIG. 2, the source of first PMOS transistor M3 and the source of second PMOS transistor M4 are connected together and to a first end of second current source 250. A second end of second current source 250 is connected to the supply voltage VDD.

The drain of first PMOS transistor M3 is connected to the first end of pull up resistor 220. The drain of second PMOS transistor M4 is connected to the first end of pull up resistor 210. The gate of first PMOS transistor M3 is connected to the input signal VIN. The gate of second PMOS transistor M4 is connected to the input signal VIP.

In the advantageous embodiment of differential amplifier 200 shown in FIG. 2 the PMOS tail current source is second current source 250. The value of bias current in current source 250 is [(2*Ix)−(1*Ipoly)]. The expression Ix represents a value of current that is any combination of: (a) a constant current (IK), (b) a transconductance based current (Igm), and (c) a temperature compensated based current (Iptat). The expression Ipoly represents a value of current that is the same as the Ipoly current in current source 130 of the prior art differential amplifier 100. In particular, the expression Ipoly represents a poly resistor based current that varies over process and temperature by a range of approximately twenty five percent (+/−25%).

The NMOS tail current source is first current source 240. The value of bias current in current source 240 is 2*Ix. As previously indicated, the expression Ix represents a value of current that is any combination of: (a) a constant current (IK), (b) a transconductance based current (Igm), and (c) a temperature compensated based current (Iptat).

First assume that the differential amplifier circuit 200 is balanced. That is, the input signal VIN is equal to the input signal VIP. When the differential amplifier circuit 200 is balanced, the value of the current through the first PMOS transistor M3 ("IM3") is one half of [(2*Ix)−(1*Ipoly)], or equivalently, (Ix−Ipoly/2). Similarly, when the differential amplifier circuit 200 is balanced, the value of the current through the second PMOS transistor M4 ("IM4") is also (Ix−Ipoly/2).

$$IM3=IM4=Ix-Ipoly/2 \qquad (1)$$

When the differential amplifier circuit 200 is balanced, the value of the current through the first NMOS transistor M1 ("IM1") is one half of (2*Ix), or equivalently, Ix. Similarly, when the differential amplifier circuit 200 is balanced, the value of the current through the second NMOS transistor M2 ("IM2") is also Ix.

$$IM1=IM2=Ix \qquad (2)$$

By applying the Kirchoff Circuit Law ("KCL") at the output node VOP and the output node VON, the current ("IRL1") that flows through pull up resistor 210 and the current ("IRL2") that flows through pull up resistor 220 may be calculated to be:

$$IRL1=IRL2=Ix-(Ix-Ipoly/2) \qquad (3)$$

$$IRL1=IRL2=Ipoly/2 \qquad (4)$$

This means that the current that flows through resistor Rcm has a value of 2*Ipoly/2, or equivalently, Ipoly.

Now assume that the differential amplifier circuit 200 is in limiting mode. That is, only one half of the differential amplifier circuit 200 is operating and all of the tail current is flowing through the operative side of the amplifier. The limiting current through first PMOS transistor M3 ("IM3") (or through second PMOS transistor M4 ("IM4")) is:

$$IM3(or\ IM4)-2*Ix-Ipoly \qquad (5)$$

In the limiting mode the limiting current though the second NMOS transistor M2 ("IM2") (or through first NMOS transistor M1 ("IM1")) is:

$$IM2(or\ IM1)-2*Ix \qquad (6)$$

Therefore, in limiting mode the current that flows through an output load resistor (either pull up resistor 210 or pull up resistor 220) is equal to Ipoly.

Now assume that the differential amplifier circuit 200 is not in limiting mode. The gain of differential amplifier circuit 200 may then be expressed as:

$$G_{m,NMOS}(Ix)+G_{m,PMOS}(Ix-Ipoly/2)*RL \qquad (7)$$

The expression $G_{m,NMOS}(Ix)$ represents the transconductance $G_m$ of the NMOS transistors (first NMOS transistor M1 and second NMOS transistor M2) and expression $G_{m,PMOS}(Ix-Ipoly/2)$ represents the transconductance $G_m$ of the PMOS transistors (first PMOS transistor M3 and second PMOS transistor M4). The expression RL represents the output load resistance.

The differential amplifier circuit 200 of the present invention provides a constant swing, high gain limiting differential amplifier cell. The differential current in the output loads (e.g., pull up resistors 210 and 220) provides the constant swing based on the Ipoly current. The differential current in the driving transistors (M1 and M2) provides the high gain. In this manner the differential amplifier circuit 200 provides both constant swing and high gain.

In terms of the gain of differential amplifier 200, the gain that is due to the complementary input and the independent bias currents for the transistors provides higher gain than prior art differential amplifiers. The technique employed by the present invention provides more optimization to maintain high transconductance ($g_m$) for the differential amplifier depending upon the choice of the current that is used to bias the transistors.

Figure 3:
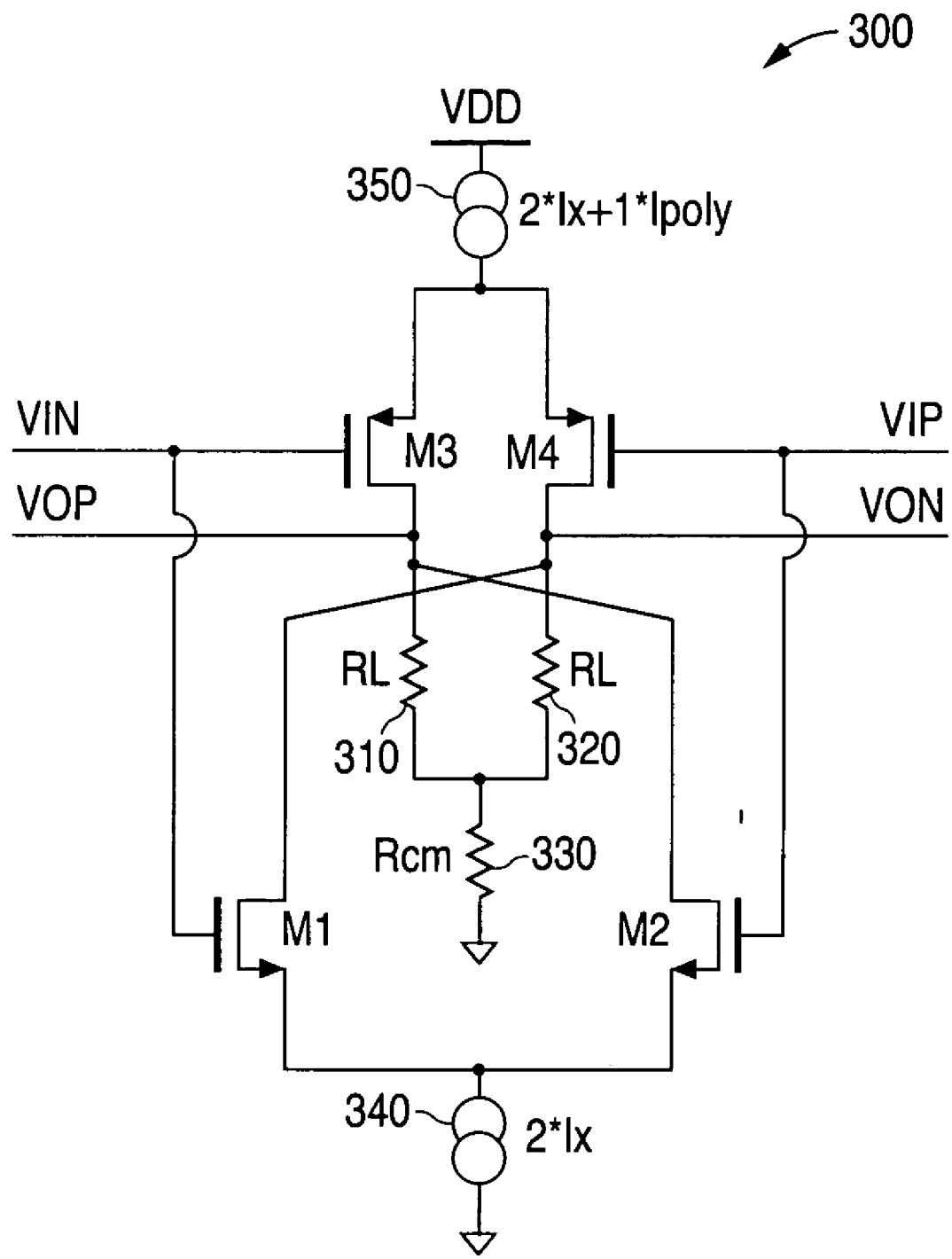
FIG. 3 illustrates a schematic diagram of a second advantageous embodiment of a constant swing, high-gain complementary input limiting differential amplifier of the present invention.

The differential amplifier circuit 200 shown in FIG. 2 represents an advantageous embodiment for voltage source (VDD) referred output. The present invention may also be configured for ground referred output. FIG. 3 illustrates a schematic diagram of an advantageous embodiment of a constant swing, high-gain complementary input limiting differential amplifier 300 of the present invention for ground referred output. The ground referred differential amplifier 300 is generally similar to the voltage source (VDD) referred differential amplifier 200. There are some differences in the manner in which the components of differential amplifier 300 are connected.

The differential amplifier circuit 300 shown in FIG. 3 comprises a first NMOS transistor M1, a second NMOS transistor M2, a first PMOS transistor M3, a second PMOS transistor M4, a pull up resistor 310 (having a value of resistance equal to RL), a pull up resistor 320 (having a value of resistance equal to RL), a resistor 330 (having a value of resistance equal to Rcm), a first current source 340 having a value of current equal to 2*Ix, and a second current source 350 having a value of current equal to (2*Ix+1*Ipoly).

As shown in FIG. 3, the source of first NMOS transistor M1 and the source of second NMOS transistor M2 are connected together and to a first end of first current source 340. A second end of first current source 340 is connected to ground. The drain of first NMOS transistor M1 is connected to a first end of pull up resistor 320 and the drain of second NMOS transistor M2 is connected to a first end of pull up resistor 310. The second end of pull up resistor 310 and the second end of pull up resistor 320 are both connected to a first end of resistor 330. A second end of resistor 330 is connected to ground.

The gate of first NMOS transistor M1 is connected to input signal VIN. The gate of second NMOS transistor M2 is connected to input signal VIP. The input signals VIN and VIP are differential input signals.

As also shown in FIG. 3, the source of first PMOS transistor M3 and the source of second PMOS transistor M4 are connected together and to a first end of second current source 350. A second end of second current source 350 is connected to the supply voltage VDD.

The drain of first PMOS transistor M3 is connected to the first end of pull up resistor 320. The drain of second PMOS transistor M4 is connected to the first end of pull up resistor 310. The gate of first PMOS transistor M3 is connected to the input signal VIN. The gate of second PMOS transistor M4 is connected to the input signal VIP. The output signal VOP is taken at the drain of first PMOS transistor M3. The output signal VON is taken at the drain of second PMOS transistor M4.

In the advantageous embodiment of differential amplifier 300 shown in FIG. 3 the PMOS tail current source is second current source 350. The value of bias current in current source 350 is [(2*Ix)+(1*Ipoly)]. The expression Ix represents a value of current that is any combination of: (a) a constant current (IK), (b) a transconductance based current (Igm), and (c) a temperature compensated based current (Iptat). The expression Ipoly represents a value of current that is the same as the Ipoly current in current source 130 of the prior art differential amplifier 100. In particular, the expression Ipoly represents a poly resistor based current that varies over process and temperature by a range of approximately twenty five percent (+/−25%).

The NMOS tail current source is first current source 340. The value of bias current in current source 340 is 2*Ix. As previously indicated, the expression Ix represents a value of current that is any combination of: (a) a constant current (IK), (b) a transconductance based current (Igm), and (c) a temperature compensated based current (Iptat).

The operation of differential amplifier 300 is similar to that of differential amplifier 200. Assume that the differential amplifier circuit 300 is not in limiting mode. The gain of differential amplifier circuit 300 may then be expressed as:

$$G_{m,PMOS}(Ix+Ipoly/2)+G_{m,NMOS}(Ix)*RL \qquad (8)$$

The expression $G_{m,NMOS}(Ix)$ represents the transconductance $G_m$ of the NMOS transistors (first NMOS transistor M1 and second NMOS transistor M2) and expression $G_{m,PMOS}(Ix+Ipoly/2)$ represents the transconductance $G_m$ of the PMOS transistors (first PMOS transistor M3 and second PMOS transistor M4). The expression RL represents the output load resistance.

The current at the differential output loads (balanced) is given by:

$$IRL1=IRL2=(Ix+Ipoly/2)-Ix \qquad (9)$$

$$IRL1=IRL2=Ipoly/2 \qquad (10)$$

Note that because only the Ipoly current flows to the differential output loads, the resistor 330 (having a resistance of Rcm) is used to provide a constant common voltage at the output (nominally at one half of the supply voltage (i.e., VDD/2)).

In complementary input amplifiers, the mobility of the PMOS transistor is always smaller than the mobility of the NMOS transistor. Therefore, in terms of matching the transconductance ($g_m$) of the PMOS transistor to the transconductance ($g_m$) of the NMOS transistor, more current is desired in the PMOS transistor to achieve a comparable transconductance ($g_m$) as the NMOS transistor.

In the embodiment shown in FIG. 3 the PMOS transistors are biased with a higher level of current than the PMOS transistors in the embodiment shown in FIG. 2. That is, the PMOS transistors shown in FIG. 3 are biased with a current of (2*Ix+1*Ipoly) and the PMOS transistors shown in FIG. 2 are biased with a current of (2*Ix−1*Ipoly). For this reason, the ground referred output in the embodiment of amplifier 300 shown in FIG. 3 will provide higher gain than the voltage source (VDD) referred output in the embodiment of amplifier 200 shown in FIG. 2.

Figure 4:
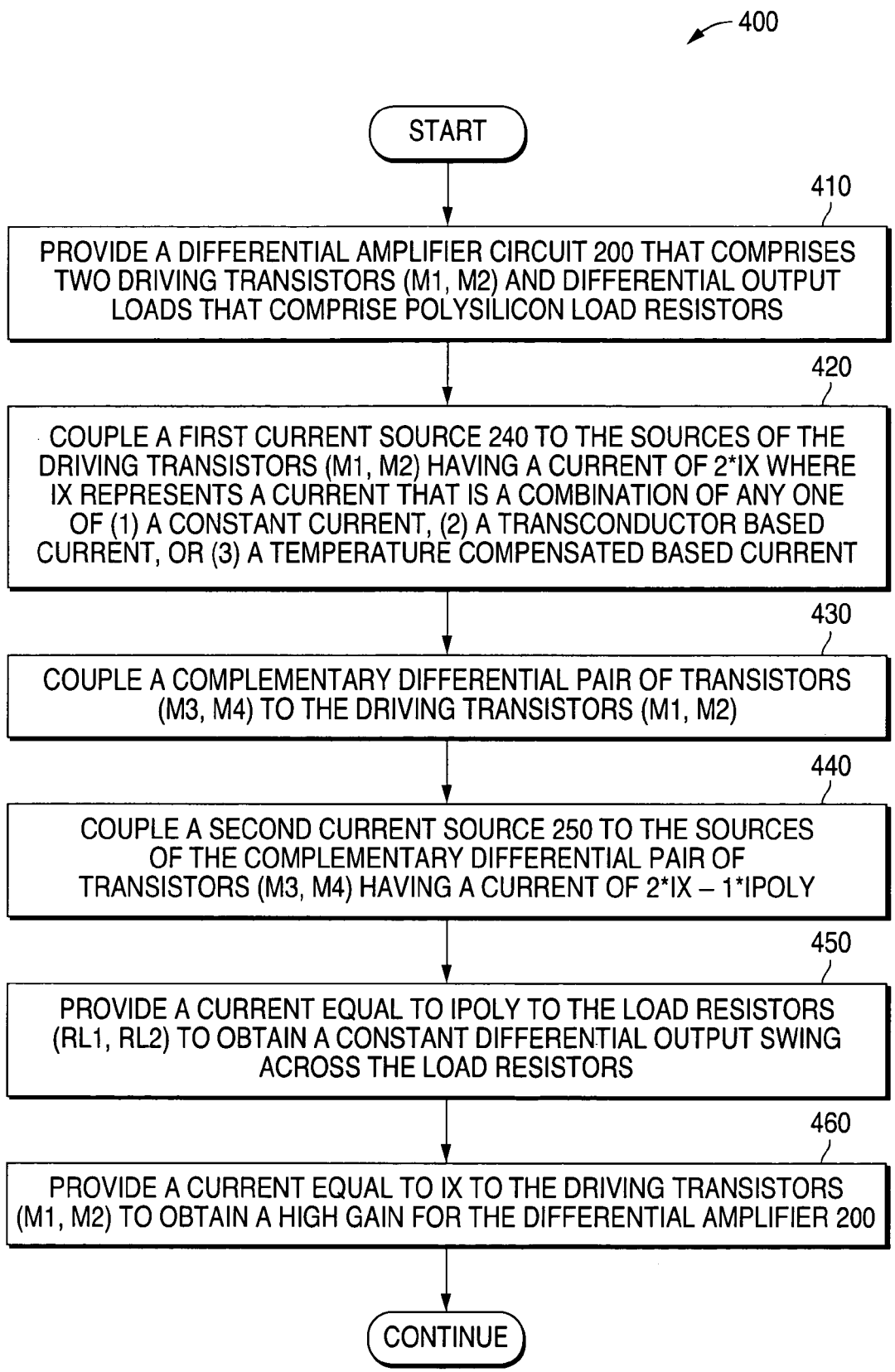
FIG. 4 illustrates a flow chart showing the steps of an advantageous embodiment of the method of the present invention.

FIG. 4 illustrates a flow chart showing the steps of an advantageous embodiment of a method of the present invention. A differential amplifier circuit 200 is provided that comprises two driving transistors (M1 and M2) and differential output loads that comprise polysilicon load resistors (step 410). A first current source 240 is coupled to the sources of the driving transistors (M1 and M2). The first current source 240 has a current of 2*Ix where Ix represents a current that is a combination of any one of (1) a constant current, (2) a transconductance based current, or (3) a temperature compensated based current (step 420).

A complementary differential pair of transistors (M3 and M4) is coupled to the driving transistors (M1 and M2) (step 430). A second current source 250 is coupled to the sources of the complementary differential pair of transistors (M3 and M4). The second current source 250 has a current of 2*Ix−1*Ipoly (step 440). A current equal to Ipoly is provided to the load resistors to obtain a constant differential output swing across the load resistors (step 450). A current equal to Ix is provided to the driving transistors (M1 and M2) to obtain a high gain for the differential amplifier 200 (step 460).

The complementary input limiting differential amplifier of the present invention provides both high gain and constant swing. The complementary input limiting differential amplifier of the present invention provides constant swing at the output while optimizing the transconductance ($g_m$) independently. This provides higher gain than prior art differential amplifiers. The differential amplifier of the present invention is also less subject to process and temperature variations.

The differential amplifier of the present invention may also be provided in either a voltage source (VDD) output referred embodiment or in a ground output referred embodiment. The efficiency of the differential amplifier of the present invention may also permit fewer gain stages to be used within a communication channel.

Although the present invention has been described with an exemplary embodiment, various changes and modifications may be suggested to one skilled in the art. It is intended that the present invention encompass such changes and modifications as fall within the scope of the appended claims.

What is claimed is:

1. A differential amplifier circuit of a type comprising a first driving transistor, a second driving transistor, a first output load resistor, and a second output load resistor, said differential amplifier circuit comprising:
   means for providing a varying differential current through said first and second output load resistors that tracks process and temperature variations within said first and second output load resistors; and
   means for providing a differential current through said first and second driving transistors.

2. The differential amplifier circuit as set forth in claim 1 wherein said means for providing the differential current comprises:
   a first current source having a first end coupled to sources of said first and second driving transistors and a second end coupled to ground, wherein a current of said first current source is two times Ix, where Ix equals a current that is a combination of one or more of: a constant current, a transconductance based current, and a temperature compensated based current.

3. The differential amplifier circuit as set forth in claim 2 wherein said means for providing the varying differential current comprises:
   a differential pair of transistors comprising a third transistor and a fourth transistor, wherein a drain of said third transistor is coupled to a drain of said second driving transistor, and wherein a drain of said fourth transistor is coupled to a drain of said first driving transistor; and
   a second current source having a first end coupled to a source of said third transistor and a source of said fourth transistor, wherein a second end of said second current source is coupled to a power supply voltage.

4. The differential amplifier circuit as set forth in claim 3 wherein a current of said second current source equals two times Ix minus Ipoly, where Ipoly equals a current that tracks the process and temperature variations within said first and second output load resistors.

5. The differential amplifier circuit as set forth in claim 4 wherein a first end of said first output load resistor is coupled to the drain of said first driving transistor and a first end of said second output load resistor is coupled to the drain of said second driving transistor; and
   wherein a second end of said first output load resistor and a second end of said second output load resistor are coupled together.

6. The differential amplifier circuit as set forth in claim 5 wherein a current that flows through said first output load resistor and a current that flows through said second output load resistor add together to equal said Ipoly current.

7. The differential amplifier circuit as set forth in claim 5 wherein said second ends of said first output load resistor and said second output load resistor are coupled to the power supply voltage through a third resistor.

8. The differential amplifier circuit as set forth in claim 1 wherein said means for providing the varying differential current provides a constant differential output swing across said first and second output load resistors.

9. The differential amplifier circuit as set forth in claim 8 wherein said means for providing the differential current provides a high gain for said differential amplifier circuit.

10. The differential amplifier circuit as set forth in claim 9 wherein said differential amplifier circuit is configured for voltage source referred output.

11. The differential amplifier circuit as set forth in claim 9 wherein said differential amplifier circuit is configured for ground referred output.

12. The differential amplifier circuit as set forth in claim 3, wherein a gate of the first driving transistor is coupled to a negative input signal, a gate of the second driving transistor is coupled to a positive input signal, a gate of the third transistor is coupled to the negative input signal, and a gate of the fourth transistor is coupled to the positive input signal.

13. A differential amplifier circuit of a type comprising a first NMOS driving transistor, a second NMOS driving transistor, a first output load resistor, and a second output load resistor, said differential amplifier circuit comprising:
   a first current source having a first end coupled to sources of said first and second NMOS driving transistors and a second end coupled to ground; and
   a differential pair of transistors comprising a third transistor and a fourth transistor, wherein a gate of the first NMOS driving transistor is coupled to a negative input signal, a gate of the second NMOS driving transistor is coupled to a positive input signal, a gate of the third transistor is coupled to the negative input signal, a gate of the fourth transistor is coupled to the positive input signal, a drain of the third transistor is coupled to a drain of the second NMOS driving transistor, and a drain of the fourth transistor is coupled to a drain of the first NMOS driving transistor.

14. The differential amplifier circuit as set forth in claim 13, wherein:
   the third and fourth transistors comprise PMOS transistors; and
   sources of said PMOS transistors are coupled to a first end of a second current source, wherein a second end of said second current source is coupled to a power supply voltage.

15. The differential amplifier circuit as set forth in claim 14 wherein a current of said second current source equals two times Ix minus Ipoly, where Ix equals a current that is a combination of one or more of: a constant current, a transconductance based current, and a temperature compensated based current, and where Ipoly equals a current that tracks process and temperature variations within said first and second output load resistors.

16. The differential amplifier circuit as set forth in claim 14 wherein:
   differential current in said first and second output load resistors provide a constant differential output swing; and
   differential current in said first NMOS driving transistor and in said second NMOS driving transistor provide high gain for said differential amplifier circuit.

17. The differential amplifier circuit as set forth in claim 14 wherein a current of said second current source equals two times Ix plus Ipoly, where Ix equals a current that is a combination of one or more of: a constant current, a transconductance based current, and a temperature compensated based current, and where Ipoly equals a current that tracks process and temperature variations within said first and second output load resistors.

18. The differential amplifier circuit as set forth in claim 17 wherein:
   differential current in said first and second output load resistors provide a constant differential output swing; and
   differential current in said first NMOS driving transistor and in said second NMOS driving transistor provide high gain for said differential amplifier circuit.

19. A method for providing a differential amplifier circuit that has a constant differential output swing and high gain, said method comprising the steps of:
   providing a differential amplifier circuit that comprises a first driving NMOS transistor, a second driving NMOS transistor, a first output load resistor, and a second output load resistor;
   coupling a first current source to sources of the first and second driving NMOS transistors; and
   coupling a differential pair of transistors comprising a third transistor and a fourth transistor to the first and second driving NMOS transistors;
   wherein a gate of the first driving NMOS transistor is coupled to a negative input signal, a gate of the second driving NMOS transistor is coupled to a positive input signal, a gate of the third transistor is coupled to the negative input signal, a gate of the fourth transistor is coupled to the positive input signal, a drain of the third transistor is coupled to a drain of the second driving NMOS transistor, and a drain of the fourth transistor is coupled to a drain of the first driving NMOS transistor.

20. The method as set forth in claim 19 wherein the third and fourth transistors comprise PMOS transistors; and
further comprising coupling a second current source to sources of said PMOS transistors, wherein said second current source has a current equal to two times Ix minus Ipoly, where Ix equals a current that is a combination of one or more of: a constant current, a transconductance based current, and a temperature compensated based current, and where Ipoly equals a current that tracks process and temperature variations within said first and second output load resistors.

21. The method as set forth in claim 20 further comprising the steps of:
providing a current equal to Ipoly to said first and second output load resistors to obtain a constant differential output swing across said first and second output load resistors; and
providing a current equal to Ix to said first and second driving NMOS transistors to obtain a high gain for said differential amplifier circuit.

* * * * *